(12) United States Patent
Savransky et al.

(10) Patent No.: US 8,377,741 B2
(45) Date of Patent: Feb. 19, 2013

(54) SELF-HEATING PHASE CHANGE MEMORY CELL ARCHITECTURE

(75) Inventors: Semyon D. Savransky, Newark, CA (US); Ilya Karpov, Santa Clara, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 779 days.

(21) Appl. No.: 12/346,524

(22) Filed: Dec. 30, 2008

(65) Prior Publication Data

US 2010/0163817 A1 Jul. 1, 2010

(51) Int. Cl.
*H01L 21/06* (2006.01)
(52) U.S. Cl. ........... 438/102; 438/103; 257/2; 257/5; 257/E21.001; 257/E21.068
(58) Field of Classification Search ........... 257/E27.084, 257/E27.103, E29.17, E29.33, E21.209, E21.645, 257/E21.656, 260, 261, 2, 5, E21.001, E21.068; 438/478, 482, 488, 758, 764, 103, 102
See application file for complete search history.

(56) References Cited

U.S. PATENT DOCUMENTS

| | | | | |
|---|---|---|---|---|
| 3,629,863 A * | 12/1971 | Neale | ...................... | 257/5 |
| 4,115,872 A * | 9/1978 | Bluhm | ...................... | 365/163 |
| 4,366,614 A * | 1/1983 | Kumurdjian | ...................... | 438/483 |
| 4,782,340 A * | 11/1988 | Czubatyj et al. | ...................... | 345/92 |
| 5,543,737 A * | 8/1996 | Ovshinsky | ...................... | 326/104 |
| 5,714,768 A * | 2/1998 | Ovshinsky et al. | ...................... | 257/40 |
| 5,825,046 A * | 10/1998 | Czubatyj et al. | ...................... | 257/2 |
| 5,933,365 A * | 8/1999 | Klersy et al. | ...................... | 365/148 |
| 6,314,014 B1 * | 11/2001 | Lowrey et al. | ...................... | 365/100 |
| 6,795,338 B2 * | 9/2004 | Parkinson et al. | ...................... | 365/163 |
| 6,967,344 B2 * | 11/2005 | Ovshinsky et al. | ...................... | 257/2 |
| 7,087,454 B2 * | 8/2006 | Campbell et al. | ...................... | 438/102 |
| 7,307,268 B2 * | 12/2007 | Scheuerlein | ...................... | 257/2 |
| 7,319,608 B2 * | 1/2008 | Hsu et al. | ...................... | 365/163 |
| 7,447,053 B2 * | 11/2008 | Liaw et al. | ...................... | 365/100 |
| 7,466,584 B1 * | 12/2008 | Parkinson et al. | ...................... | 365/163 |
| 7,589,343 B2 * | 9/2009 | Lowrey | ...................... | 257/4 |
| 7,646,630 B2 * | 1/2010 | Lowrey et al. | ...................... | 365/163 |
| 7,652,914 B2 * | 1/2010 | Nirschl et al. | ...................... | 365/163 |
| 7,701,760 B2 * | 4/2010 | Campbell et al. | ...................... | 365/163 |
| 7,755,935 B2 * | 7/2010 | Lam et al. | ...................... | 365/163 |
| 7,808,807 B2 * | 10/2010 | Parkinson et al. | ...................... | 365/63 |
| 2003/0214856 A1 * | 11/2003 | Pellizzer et al. | ...................... | 365/200 |
| 2004/0113136 A1 * | 6/2004 | Dennison | ...................... | 257/2 |
| 2004/0114413 A1 * | 6/2004 | Parkinson et al. | ...................... | 365/100 |
| 2004/0114428 A1 * | 6/2004 | Morikawa | ...................... | 365/158 |
| 2004/0203183 A1 * | 10/2004 | Cho et al. | ...................... | 438/102 |
| 2005/0145984 A1 * | 7/2005 | Chen et al. | ...................... | 257/532 |
| 2005/0205964 A1 * | 9/2005 | Chen | ...................... | 257/528 |
| 2006/0072357 A1 * | 4/2006 | Wicker | ...................... | 365/163 |

(Continued)

OTHER PUBLICATIONS

Sadeghipour et al., "Phase Change Random Access Memory, Thermal Analysis" IEEE (2006): pp. 660-665.*

(Continued)

*Primary Examiner* — Hsien Ming Lee
*Assistant Examiner* — Michele Fan
(74) *Attorney, Agent, or Firm* — Seed IP Law Group PLLC (57) ABSTRACT

A method for manufacturing a phase change memory includes forming a phase change memory cell by forming a phase change layer between two switching layers. The phase change layer is separated from thermal heat sinks, such as the bitline or wordline, by the switching layers.

35 Claims, 8 Drawing Sheets

U.S. PATENT DOCUMENTS

| | | | |
|---|---|---|---|
| 2006/0084227 A1* | 4/2006 | Besana et al. | 438/257 |
| 2006/0097341 A1* | 5/2006 | Pellizzer et al. | 257/528 |
| 2006/0120136 A1* | 6/2006 | Dennison et al. | 365/148 |
| 2006/0138467 A1* | 6/2006 | Lung | 257/209 |
| 2006/0158928 A1* | 7/2006 | Pellizzer et al. | 365/163 |
| 2006/0221734 A1* | 10/2006 | Bedeschi et al. | 365/201 |
| 2006/0255328 A1* | 11/2006 | Dennison | 257/4 |
| 2006/0278900 A1* | 12/2006 | Chang et al. | 257/248 |
| 2007/0002608 A1* | 1/2007 | Hsu et al. | 365/163 |
| 2007/0045606 A1* | 3/2007 | Magistretti et al. | 257/4 |
| 2007/0105267 A1* | 5/2007 | Karpov et al. | 438/95 |
| 2007/0200202 A1* | 8/2007 | Nowak et al. | 257/613 |
| 2007/0211513 A1* | 9/2007 | Liaw et al. | 365/148 |
| 2007/0217254 A1* | 9/2007 | Matsuoka et al. | 365/163 |
| 2007/0297213 A1* | 12/2007 | Czubatyj et al. | 365/148 |
| 2008/0013370 A1* | 1/2008 | Johnson | 365/163 |
| 2008/0035905 A1* | 2/2008 | Parkinson | 257/2 |
| 2008/0042119 A1* | 2/2008 | Sandoval et al. | 257/4 |
| 2008/0062754 A1* | 3/2008 | Dodge et al. | 365/163 |
| 2008/0067485 A1* | 3/2008 | Besana et al. | 257/2 |
| 2008/0102560 A1* | 5/2008 | Hamamjy et al. | 438/102 |
| 2008/0191188 A1* | 8/2008 | Jeong | 257/4 |
| 2008/0203374 A1* | 8/2008 | Chuo et al. | 257/2 |
| 2008/0258129 A1* | 10/2008 | Toda | 257/5 |
| 2008/0273379 A1* | 11/2008 | Gordon et al. | 365/163 |
| 2009/0040819 A1* | 2/2009 | Cho et al. | 365/163 |
| 2009/0067229 A1* | 3/2009 | Kang et al. | 365/163 |
| 2009/0298222 A1* | 12/2009 | Lowrey et al. | 438/102 |
| 2009/0302294 A1* | 12/2009 | Kim | 257/2 |
| 2009/0303784 A1* | 12/2009 | Lowrey | 365/163 |
| 2009/0310402 A1* | 12/2009 | Parkinson | 365/163 |
| 2010/0059729 A1* | 3/2010 | Hudgens | 257/2 |
| 2010/0163818 A1* | 7/2010 | Lee et al. | 257/2 |

OTHER PUBLICATIONS

Small et al., "Thermal Analysis of Cell Design for Phase Change Random Access Memory (PCRAM)", IEEE, Jun. 2008: pp. 1046-1054.*

* cited by examiner

SELF-HEATING PHASE CHANGE MEMORY CELL ARCHITECTURE

BACKGROUND

1. Technical Field

The present disclosure relates generally to phase change memories.

2. Description of the Related Art

Phase change memory devices use phase change materials, i.e., materials that may be electrically switched between a generally amorphous and a generally crystalline state or between different detectable states of local order across the entire spectrum between completely amorphous and completely crystalline states, for electronic memory application. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

A phase change memory device includes an array of memory cells, each memory cell comprising a memory element and a selection element. Both the memory element and the selection element may be made of a chalcogenide material. The memory element and the selection element may be sandwiched between a lower electrode and an upper electrode. Select devices may also be referred to as an access device, an isolation device, or a switch.

Programming of the phase change material to alter its state or phase may be accomplished by applying voltage potentials across the electrodes, thereby generating a voltage potential across the select device and the memory element. When the voltage potential is greater than the threshold voltages of the select device and the memory element, an electrical current may flow through the phase change material in response to the applied voltage potentials, and may result in heating of the phase change material.

This heating may alter the memory state or phase of the phase change material, thus altering the electrical characteristic of the memory material, e.g., the resistance. Thus, the memory material may also be referred to as a programmable resistance material.

The amorphous or semi-amorphous state may be associated with a "reset" state or a logic "0" value, while a crystalline or semi-crystalline state may be associated with a "set" state, or a logic "1" value. The resistance of memory material in the amorphous or semi-amorphous state is generally greater than the resistance of memory material in the crystalline or semi-crystalline state. It is to be appreciated that the association of reset and set with amorphous and crystalline states, respectively, is a convention and that at least an opposite convention may be adopted.

Using an electrical current, the memory material may be heated to a relatively higher temperature to amorphize memory material and "reset" memory material (e.g., program memory material to "0"). Heating the volume of memory material to a relatively lower crystallization temperature may crystallize memory material and "set" memory material (e.g., program memory material to "1"). Various resistances of memory material may be achieved to store information by varying the amount of current flow and duration through the volume of memory material.

Figure 1:
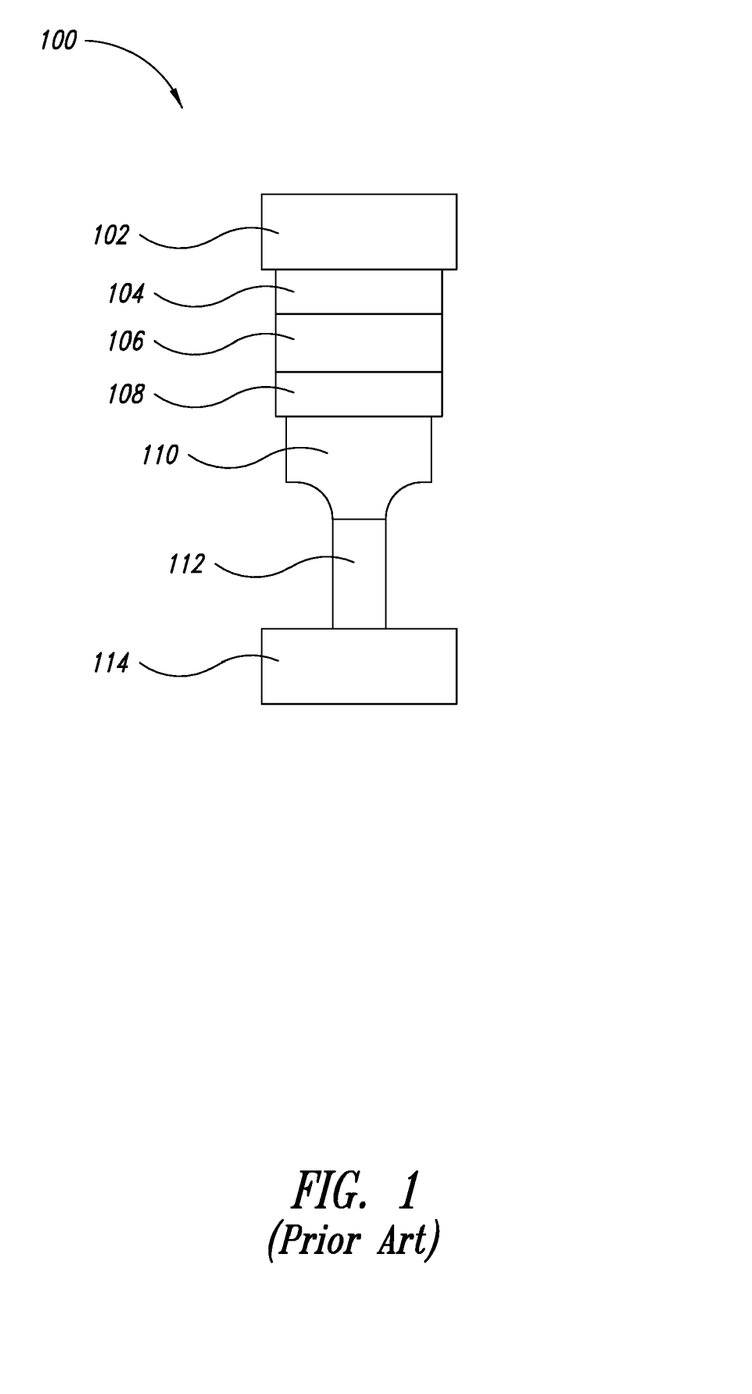
FIG. 1 shows an enlarged cross-sectional view of a known arrangement of a phase change memory cell.

Referring to FIG. 1, a conventional phase change memory cell 100 includes a phase change layer 110 and an ovonic threshold switch (OTS) 106 positioned between a top and a bottom electrode, 104 and 112 respectively. A middle electrode 108 is located between the phase change layer 110 and the OTS 106. The top electrode 104 is aligned with a bitline 102 and separates the bitline 102 from the OTS 106. The phase change layer 110 is in direct contact with the bottom electrode 112. In this arrangement, the heat from the phase change layer 110 escapes through the bottom electrode 112, which is in direct contact with a wordline 114. The wordline 114 acts as a thermal sink drawing away heat that could otherwise be used for altering the phase of the phase change layer 110. Therefore, the programming current must be increased to achieve a temperature sufficient to program the phase change layer 110.

BRIEF SUMMARY

In accordance with one embodiment of the present disclosure, a method includes forming a phase change memory cell. The forming of the phase change memory cell includes forming a first switching layer, forming a phase change layer, and forming a second switching layer, the first and second switching layers being separated by the phase change layer.

DETAILED DESCRIPTION

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale. For example, the shapes of various features are not drawn to scale, and some of these features are arbitrarily enlarged and positioned to improve drawing legibility.

Figure 2:
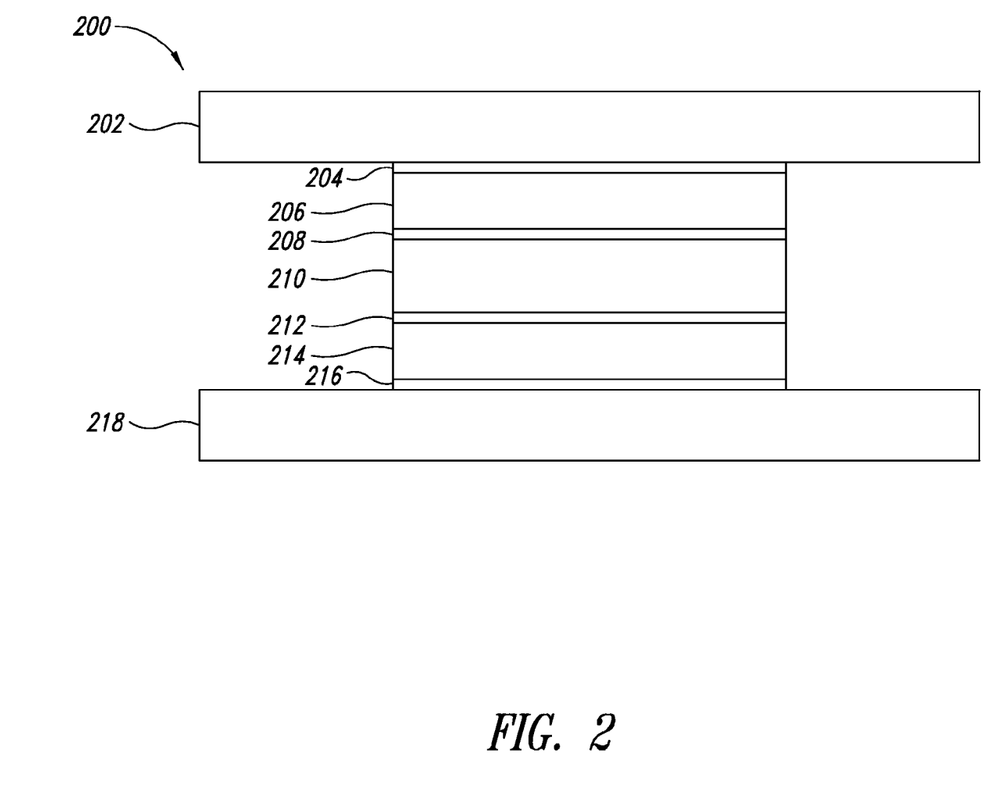
FIG. 2 is an enlarged cross-sectional view of one embodiment of the present disclosure.

FIG. 2 illustrates a self-heating phase change memory (PCM) cell 200 in accordance with one embodiment of the present disclosure. The phase change memory cell 200 includes a PCM layer 210 sandwiched by two switching layers 206 and 214. A top electrode 204 separates the first switching layer 206 from a bitline 202. A bottom electrode 216 separates the second switching layer 214 from a wordline 218. In this embodiment, the switching layers 206, 214 isolate the hottest portion of the phase change layer 210 from the conductive electrodes 204 and 216, and, therefore, from the bitline 202 and wordline 218.

The PCM layer 210 is typically formed with one or more chalcogenide elements (i.e., Group VI elements from the periodic table). One common chalcogenide combination is GST (Germanium-Antimony-Tellurium). However, any known suitable phase change material may be used.

The switching layers 206 and 214 may operate as switches that are either "off" or "on" depending on the amount of voltage potential applied across the memory cell. More particularly, when the current through the switches exceeds a threshold current or voltage the switches are triggered into the on state. The off state is a substantially electrically nonconductive state and the on state is a substantially conductive state, with less resistance than the off state.

In one embodiment, switching layers 206 and 214 are ovonic threshold switches (OTS). An OTS is typically a glass switch, which after being brought from highly resistive state to conducting state, returns to highly resistive state when current falls below a holding current value. In one embodiment, the OTS may be STAG (SiTeAsGe). The switching layers 206 and 214 may be formed of the same or different materials. Alternative materials include an oxide or any other material or configuration with switching properties.

The switching layers 206, 214 thermally isolate the phase change layer by positioning the hottest point of the phase change layer 210 away from the conductive top and bottom electrodes (204, 216). The isolation of the PCM layer 210 advantageously reduces programming current by minimizing the heat loss through the top and bottom electrodes 204, 216 and the bitline 202 and wordline 218, which otherwise would act as thermal heat sinks. With less heat loss, a lower programming current can be used to alter the phase of the phase change layer 210.

In addition, the lower heat loss and physical isolation provided by the switching layers 206 and 214 minimize the chemical and electrochemical interaction between the phase change layer 210 and the electrode layers 204 and 216. The minimization of these interactions and the lower programming current improves memory cell endurance.

The phase change memory cell 200 includes electrodes to separate the phase change layer 210 from the switching layers 206 and 214. A first middle electrode 208 separates the PCM layer 210 from the top electrode 204. A second middle electrode 212 separates the PCM layer 210 from the bottom electrode 216. Neither the first or second middle electrode (208, 212) are in contact with any thermal heat sink, such as the bitline 202 or the wordline 218. The middle electrodes 208, 212 act as diffusion barriers between the PCM layer 210 and the switching layers 206, 214. However, in some alternate embodiments, the PCM layer 210 directly contacts the switching layers 206, 214 without any middle electrodes.

Figure 3:
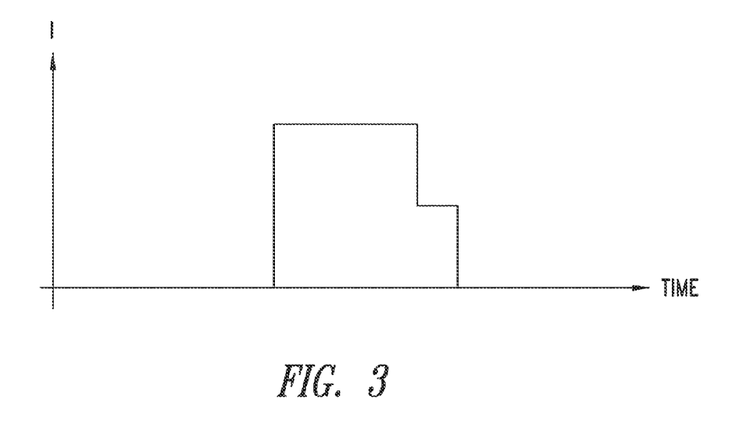
FIG. 3 is an example of a programming pulse for resetting a phase change memory cell according to one embodiment of the present disclosure.

Programming of the PCM cell 200 occurs by pulses of current applied between the bitline 202 and the wordline 218. In one embodiment, the programming current rises from zero to the "reset" current value and holds the "reset" current value for up to 100 ns to melt the phase change layer 210. In some embodiments, in order to obtain effective cooling of the molten PCM layer 210, the current pulse decreases to 50%-80% of the "reset" current value for 10-100 ns before returning to zero, as shown in FIG. 3. The reduction in the programming current to 50-80% of the reset current value ensures that the OTS layers 206, 214 remain ON (conductive) while the phase change layer 210 begins cooling. The step down in programming current more effectively quenches the PCM layer 210 to a vitreous (amorphous) state by removing the heat in the PCM layer through the highly conductive OTS layers 206, 214 to the thermal sinks of the bitline 202 and wordline 218.

The cooling stage determines if the PCM layer 210 solidifies in a high or low resistive state. A faster cooling process arranges the phase change layer 210 in the high resistance state, the "reset" state. A slower cooling process arranges the phase change layer 210 in the low resistance state, the "set" state.

Figure 4:
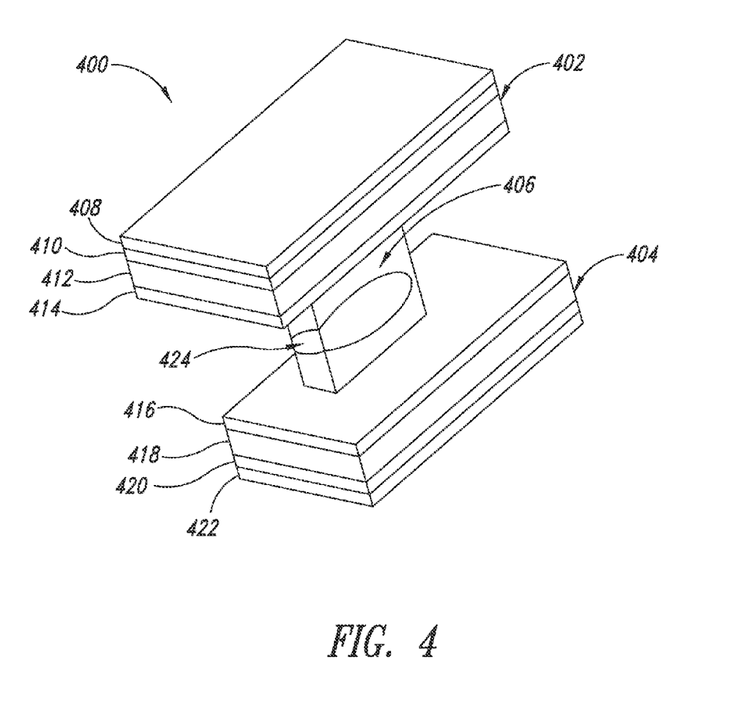
FIG. 4 is an enlarged isometric view of a phase change memory cell.

FIG. 4 illustrates a PCM cell 400 according to one embodiment. The PCM cell 400 includes a wall-shaped PCM layer 406 sandwiched between a wordline stack 404 and a bitline stack 402. The bitline stack 402 includes, from top to bottom, a bitline layer 408, a top electrode layer 410, an OTS layer 412, and a first middle electrode 414. The wordline stack 404 includes, from top to bottom, a second middle electrode 416, an OTS layer 418, a bottom electrode layer 420, and a wordline layer 422.

The bitline and wordline layers 408, 422 can be of any conductive material, and are copper in one embodiment. The top and bottom electrode layers 410, 420 also can be of any conductive material. If the bitline and wordline layers 408, 422 are copper, then the top and bottom electrode layers 410, 420 preferably are copper barrier materials to prevent diffusion of the copper into the OTS layers 412, 418. Some examples of copper barrier materials that can be employed include cobalt, ruthenium, tantalum, tantalum nitride, indium oxide, tungsten nitride, and titanium nitride (the last four being conductive ceramics). As mentioned above with regard to FIG. 2, the middle electrodes 414, 416 are optional layers that limit diffusion between the PCM layer 406 and the OTS layers 412, 418.

FIG. 4 also illustrates a hottest temperature region 424 of the PCM layer 406 and how it is isolated from the bitline layer 408 and the wordline layer 422. The OTS layers 412, 418 and middle electrodes 414, 416 together with vertical wall shape of the PCM layer 406 physically and thermally isolate the hottest temperature region 424 from the heat sinking nature of the bitline and wordline layers 408, 422.

Figure 13:
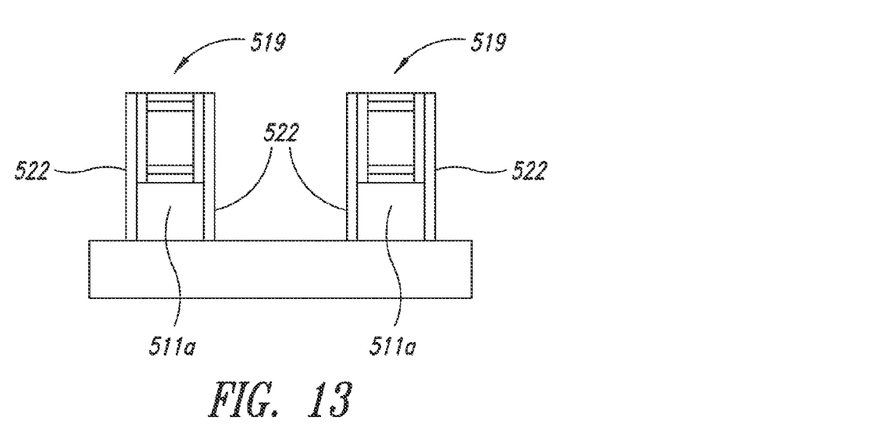
Figure 14:
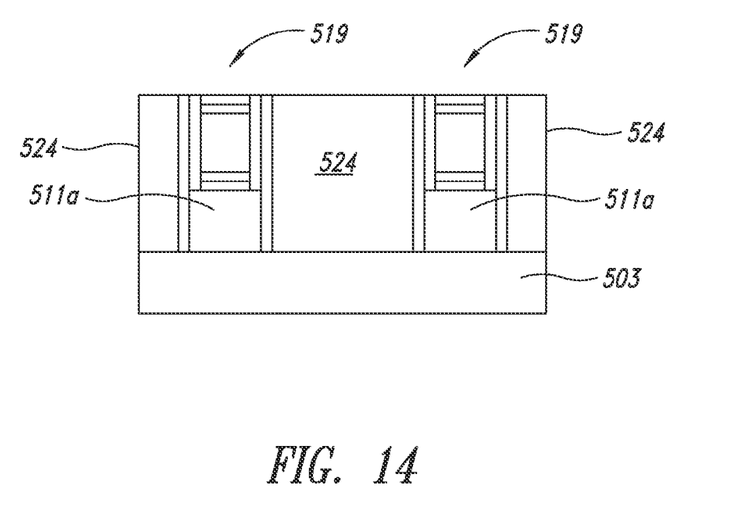
Figure 15:
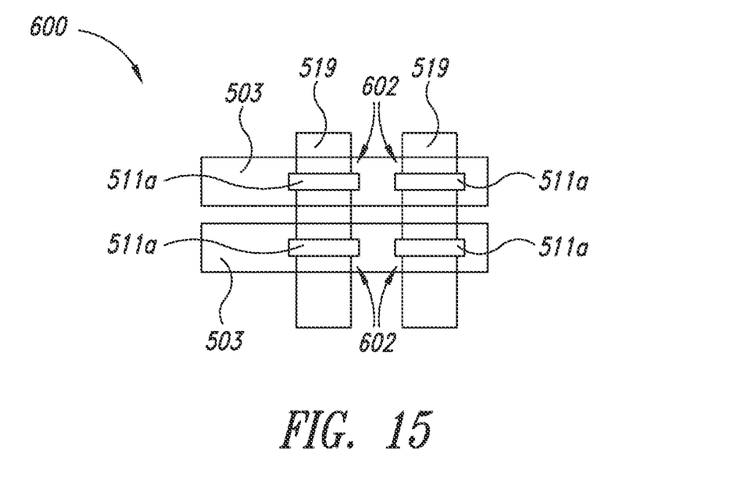
FIG. 15 is an enlarged top view of an array of phase change memory cells manufactured according to the process illustrated in FIGS. 5-14.

FIGS. 5-14 illustrate a fabrication process for making a phase change memory 600, as shown in FIG. 15, according to one embodiment the present disclosure. The process described with respect to FIGS. 5-14 discusses the fabrication of the PCM 600 with four PCM cells 602, but those skilled in the art would instantly recognize that the process can be implemented to make many more PCM cells in the PCM 600. One skilled in the art will recognize that other sequences and other steps could be employed to make the phase change memories described herein.

Figure 5:
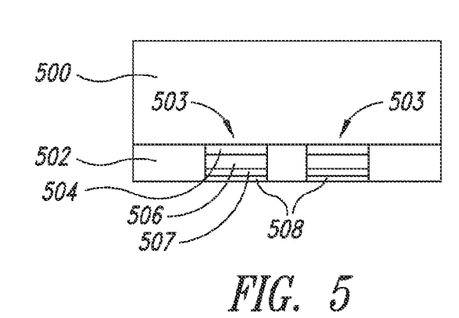
FIGS. 5-14 are enlarged, cross-sectional views of one embodiment of the present disclosure at subsequent stages of manufacture.

Initially, two wordline stacks 503 are formed within a dielectric layer 502. Each wordline stack 503 includes a wordline interconnect 508, a bottom electrode 507, an OTS layer 506, and a middle electrode 504. However, the middle electrode 504 is an optional feature and may be omitted as discussed above.

Another dielectric layer 500 may be deposited over the electrodes 504 and the dielectric layer 502. The dielectric layer 500 can be a single layer of dielectric, such as silicon oxide, or can be a dielectric stack of 2 or more layers, such as a combination of silicon nitride and silicon oxide. A chemical mechanical planarization (CMP) technique may be used to remove excess material deposited.

In one embodiment, the OTS layer 506, the electrodes 504 and 507, and the wordline interconnect 508 are deposited as layers on a semiconductor substrate and then etched in a self-aligned etching step using a single mask to form the desired configuration. After the self-aligned etching step, the dielectric layer 502 is then deposited and etched back, such as by CMP, to the top level of the middle electrode 504. Alternatively, after the self-aligned etching step, the dielectric layers 502 and 500 could be deposited together as a single layer to surround the wordline stacks 503, laterally and on top.

Alternatively, the wordline stacks 503 can be formed according to a damascene process in which the dielectric layer 502 is deposited first on the semiconductor substrate and etched to form openings, such as pores or trenches. The wordline interconnect 508, bottom electrode 507, OTS layer 506, and middle electrode 504 are then formed in the openings by successive deposition and etch-back steps. After the wordline stacks 503 are formed, the second dielectric layer 500 is deposited on the stacks and the first dielectric layer 502. Such a damascene process can be employed regardless of the materials used in the wordline stacks 503, but is particularly useful if the wordline interconnect 508 is copper.

Figure 6:
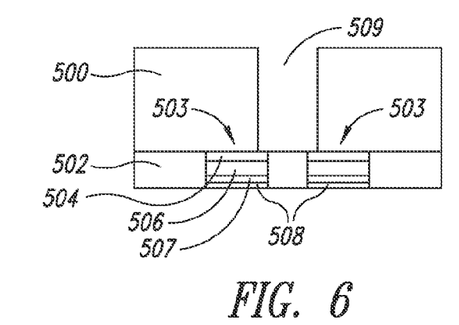

Thereafter, as shown in FIG. 6, a trench 509 is formed in the dielectric layer 500 and over both of the wordline stacks 503. The trench 509 may be formed by a dielectric etch technique that exposes a portion of the surface of each of the electrodes 504. Ideally, the trench 509 is positioned to expose an equal amount of the surface of each electrode 504.

Figure 7:
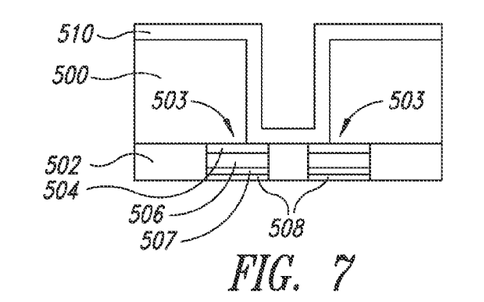
Figure 8:
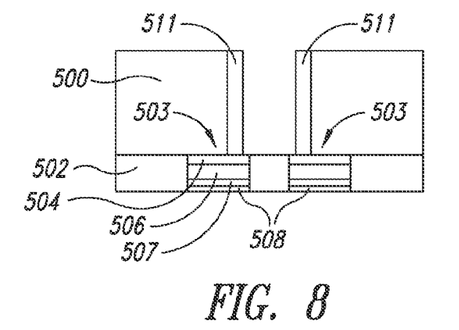

As shown in FIG. 7, a phase change layer 510 is deposited over the dielectric layer 500 and conformally in the trench 509. The phase change layer 510 is etched to form phase change spacers 511, as shown in FIG. 8. Preferably, the entire width of the phase change spacers 511 is within the boundary of the respective wordline stack 503, i.e., the entire bottom surfaces of the phase change spacers 511 is in contact with the middle electrodes 504, respectively. The phase change spacers 511 may be positioned at any location on the surfaces of electrodes 504 and preferably are a sufficient distance apart to minimize bit disturbances (i.e., cross-talk) caused by heating of neighboring phase change memory cells.

Figure 9:
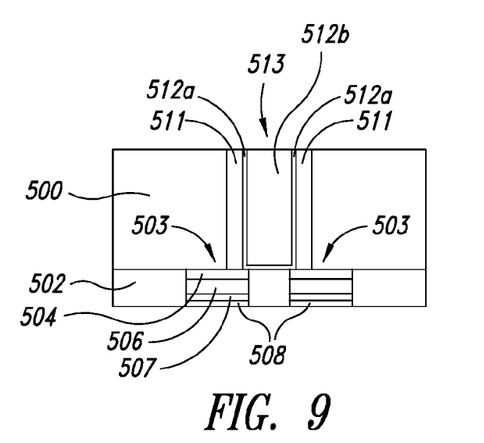

Subsequently, the trench 509 is filled with a dielectric 513, as shown in FIG. 9. In one embodiment, the dielectric layer 513 may include an encapsulation layer 512A, such as silicon nitride, and a fill layer 512B, such as silicon oxide, on the encapsulation layer and filling the trench 509. The encapsulation layer 512A is conformally deposited on the bottom of the trench 509, the sidewalls of the phase change spacers 511, and the top of the second dielectric layer 500, to encapsulate the phase change spacers 511. The dielectric fill layer 512B is deposited on the encapsulation layer 512A and fills the space remaining in the trench 509. The encapsulation and dielectric fill layers 512A, 512B may then be etched back, such as by CMP, to remove the portions of those layer on the second dielectric layer 500 outside of the trench 509.

Figure 10:
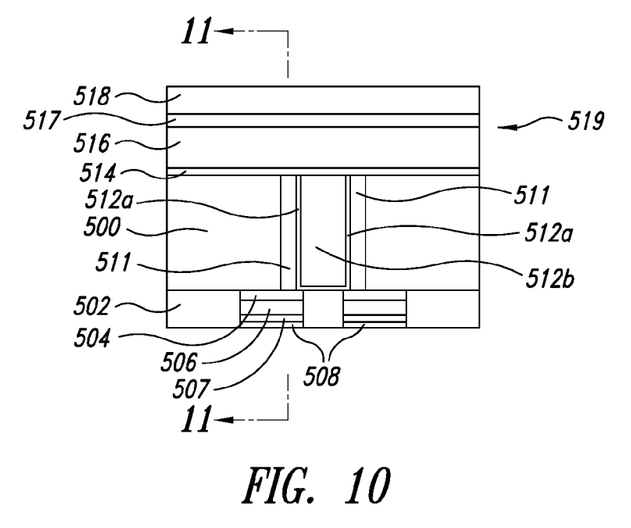

In FIG. 10, a pair of bitline stacks 519 are formed on the second dielectric layer and the phase change spacers 511, transversely with respect to the phase change spacers. As with the wordline stacks 503, the bitline stacks 519 can be formed using additive or subtractive processes. For example, in one embodiment a middle electrode layer 514, an OTS layer 516, a top electrode layer 517 and a bitline interconnect layer 518 are deposited as sheets on the entire structure, including the phase change spacers 511, the dielectric layer 500, and the dielectric layers 512A and 512B in the trench.

Figure 11:
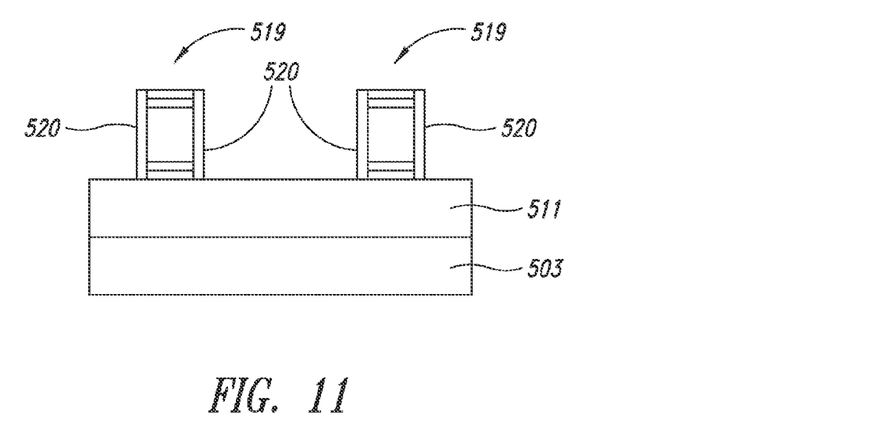
Figure 12:
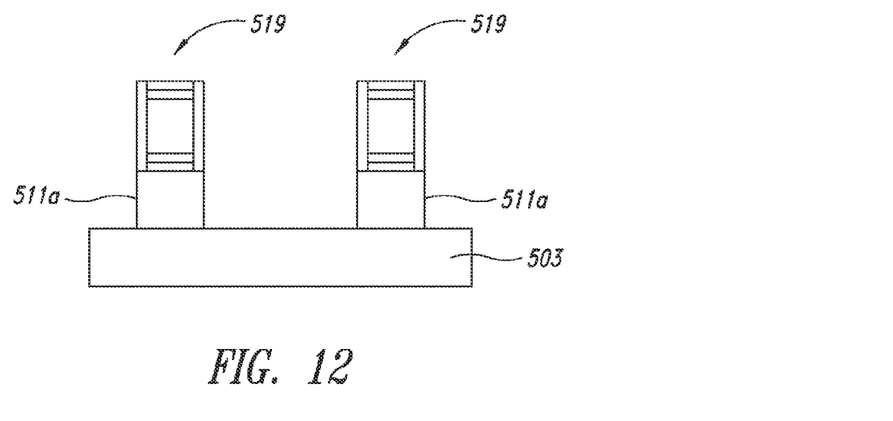

The sheets are then etched back in a self-aligned etch using a single mask to form the bitline stacks 519, as shown in FIG. 11 (which is a cross-section transverse to the cross-sections of FIGS. 5-10, taken along line 11-11 of FIG. 10). The sidewalls of the bitline stacks 519 are then encapsulated with a thin encapsulation layer 520, such as silicon nitride. Then, another self-aligned etch is performed, which cuts the phase change spacers 511 into individual PCM segments 511A of the PCM cells 602, as shown in FIG. 12, and stops at the first middle electrodes 504 of the wordline stacks 503. The edges of the PCM segments 511A (and optionally, the edges of the bitline stacks 519) are then encapsulated with another encapsulation layer 522, such as silicon nitride, as shown in FIG. 13. Another dielectric layer 524, such as silicon oxide, is then deposited on the entire structure, and etched back, such as by CMP, to surround the bitline stacks 503 and PCM segments 511A, as shown in FIG. 14.

FIG. 15 is a top view of the PCM 600 including the PCM cells 602 produced by the fabrication process illustrated in FIGS. 5-14. The bitline stacks 519 are formed transversely to the wordline stacks 503. The bitline stacks 519 are on and in contact with the top surfaces of respective lines of the PCM segments 511A and the wordline stacks 503 are below and in contact with the bottom surfaces of respective lines of the PCM segments 511A transverse to the bitline stacks 519, in a cross-point array structure.

Alternatively to the process discussed with respect to FIGS. 10-14, the bitline stacks 519 could be formed in a damascene process like that discussed above with respect to the wordline stacks 503. In such a process, the PCM segments 511A would be formed first, followed by the dielectric layer 524, trenches in the dielectric layer above the PCM segments, and the layers of the bitline stacks 519 in the trenches.

Figure 16:
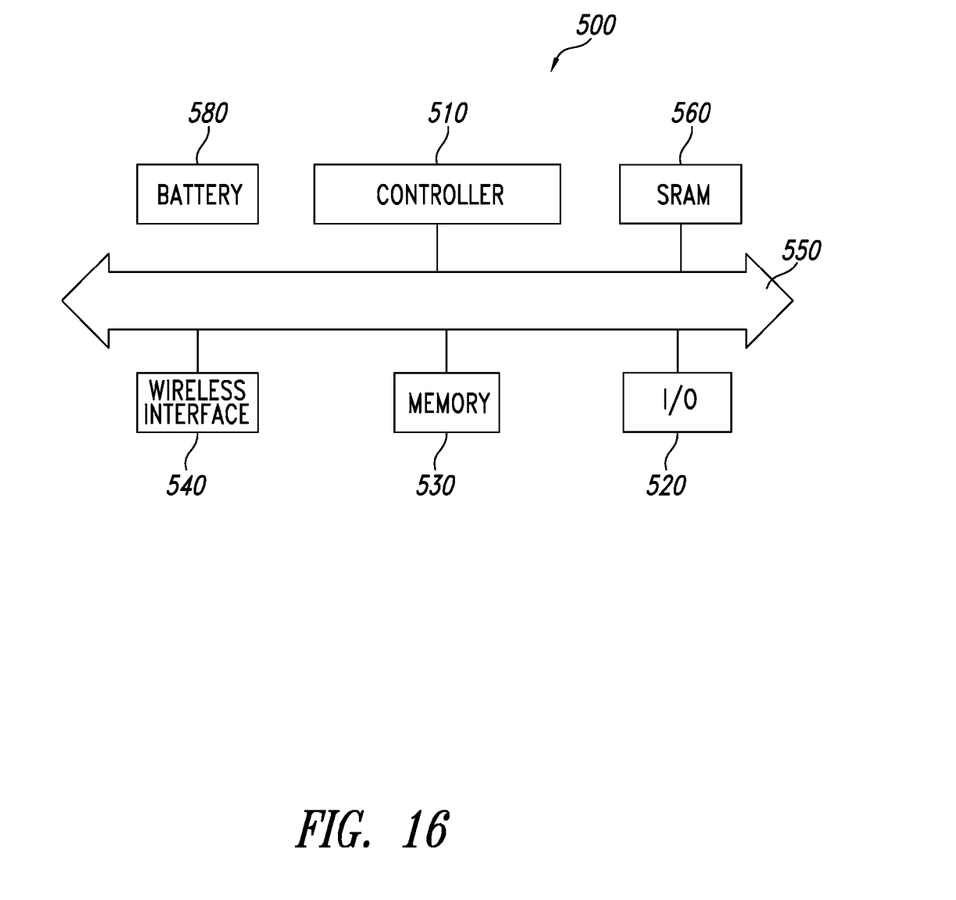
FIG. 16 is a block diagram of a system that includes a phase change memory.

Turning to FIG. 16, a portion of a system 500 in accordance with an embodiment of the present disclosure is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g., a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

Advantageously, the embodiments discussed above can significantly reduce programming currents. A reduction in programming current results in a reduction in the heat dissipation and therefore increases the reliability of the memory device. Additionally, the embodiments minimize thermal cross-talk between phase change memory cells, enabling a higher memory density. As a result, memory cells may be placed closer together without the drawbacks of bit disturbance.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
   forming first and second phase change memory cells, the forming including:
   forming a first ovonic threshold switch layer;
   forming a first phase change layer on the first ovonic threshold switch layer; and
   forming a second ovonic threshold switch layer on the first phase change layer, the first and second ovonic threshold switch layers being separated by the first phase change layer;
   forming a first dielectric layer;
   forming first and third ovonic threshold switches from the first ovonic threshold switch layer in the first dielectric layer, the third ovonic threshold switch being spaced apart from the first ovonic threshold switch;
   forming first and second phase change regions from the first phase change layer, the first phase change region being on the first ovonic threshold switch and the second phase change region being on the third ovonic threshold switch; and
   forming second and fourth ovonic threshold switches from the second ovonic threshold switch layer, the second ovonic threshold switch being on the first phase change region and the fourth ovonic threshold switch being on the second phase change region.

2. The method of claim 1, comprising forming a first and a second electrode layer, wherein the first electrode layer separates the first ovonic threshold switch layer and the first phase change layer, and the second electrode layer separates the second ovonic threshold switch layer and the first phase change layer.

3. The method of claim 1, comprising forming a bitline separated from the first phase change layer by the second ovonic threshold switch layer.

4. The method of claim 3, comprising forming an electrode layer separating the bitline and the second ovonic threshold switch layer.

5. The method of claim 1, comprising forming a wordline separated from the first phase change layer by the first ovonic threshold switch layer.

6. The method of claim 5, comprising forming an electrode layer separating the wordline and the first ovonic threshold switch layer.

7. The method of claim 1, comprising:
   depositing a second dielectric layer over the first and third ovonic threshold switches and the first dielectric layer;
   forming a trench in the second dielectric layer, the trench being positioned over the first and third ovonic threshold switches;
   forming the first phase change layer along sidewalls of the trench; and
   forming the first and second phase change regions as sidewall spacers by anisotropically etching the first phase change layer.

8. The method of claim 7, comprising:
   depositing a third dielectric layer in the trench separating the first and second phase change regions, wherein the second and fourth ovonic threshold switches are parts of a single continuous ovonic threshold switch formed on the phase change regions and third dielectric layer.

9. A phase change memory comprising:
   a first phase change memory cell including:
   a first ovonic threshold switch formed from a first ovonic threshold switch layer;
   a first phase change region formed from a first phase change layer on the first ovonic threshold switch layer; and
   a second ovonic threshold switch formed from a second ovonic threshold switch layer on the first phase change layer, the first and second ovonic threshold switch layers being separated by the first phase change layer
   a second phase change memory cell adjacent to the first phase change memory cell, the second phase change memory cell including:
   a second phase change region formed from the first phase change layer;
   a third ovonic threshold switch formed from the first ovonic threshold switch layer; and
   a fourth ovonic threshold switch formed from the second ovonic threshold switch layer, the third and fourth ovonic threshold switches being separated by the second phase change region.

10. The phase change memory of claim 9, comprising a first electrode layer separating the first ovonic threshold switch layer and the first phase change layer, and a second electrode layer separating the second ovonic threshold switch layer and the first phase change layer.

11. The phase change memory of claim 9, comprising a bitline separated from the first phase change layer by the second ovonic threshold switch layer.

12. The phase change memory of claim 11, comprising an electrode layer separating the bitline and the second ovonic threshold switch layer.

13. The phase change memory of claim 9, comprising a wordline separated from the first phase change layer by the first ovonic threshold switch layer.

14. The phase change memory of claim 13, comprising an electrode layer separating the wordline and the first ovonic threshold switch layer.

15. The phase change memory of claim 9, wherein the second and fourth ovonic threshold switches are parts of a single continuous ovonic threshold switch.

16. A system, comprising:
   a processor; and
   a first phase change memory cell, the first phase change memory cell including:
   a first ovonic threshold switch formed from a first ovonic threshold switch layer;
   a first phase change region formed from a first phase change layer on the first ovonic threshold switch layer; and a second ovonic threshold switch formed from a second ovonic threshold switch layer on the first phase change layer, the first and second ovonic threshold switch layers being separated by the first phase change layer;

a second phase change memory cell adjacent to the first phase change memory cell, the second phase change memory cell including:

a second phase change region formed from the first phase change layer;

a third ovonic threshold switch formed from the first ovonic threshold switch layer; and a fourth ovonic threshold switch formed from the second ovonic threshold switch layer, the third and fourth ovonic threshold switches being separated by the second phase change region.

17. The system of claim 16, comprising first and second electrode layers, wherein the first electrode layer separates the first ovonic threshold switch layer and the first phase change layer, and the second electrode layer separates the second ovonic threshold switch layer and the phase change layer.

18. The system of claim 16, comprising a bitline separated from the first phase change layer by the second ovonic threshold switch layer.

19. The system of claim 18, comprising an electrode layer separating the bitline and the second ovonic threshold switch layer.

20. The system of claim 16, comprising a wordline separated from the first phase change layer by the first ovonic threshold switch layer.

21. The system of claim 20, comprising an electrode layer separating the wordline and the first ovonic threshold switch layer.

22. The system of claim 16, wherein the second and fourth ovonic threshold switches are parts of a single continuous ovonic threshold switch.

23. A method, comprising:
forming a first and a second phase change memory cell, the forming including:
forming a first ovonic threshold switch spaced from a second ovonic threshold switch in a first dielectric layer;
forming a second dielectric layer over the first and second ovonic threshold switches and the first dielectric layer;
forming a trench in the second dielectric layer, the trench being positioned over the first and second ovonic threshold switches;
forming a phase change layer along sidewalls of the trench;
forming a first and a second phase change region as sidewall spacers by anisotropically etching the phase change layer, the first phase change region being positioned on the first ovonic threshold switch and the second phase change region being positioned on the second ovonic threshold switch; and
forming a third ovonic threshold switch and a fourth ovonic threshold switch on the first phase change region and the second phase change region, respectively, the first and third ovonic threshold switches being separated by the first phase change region and the second and fourth ovonic threshold switches being separated by the second phase change region.

24. The method of claim 23, comprising forming a first electrode separating the first ovonic threshold switch and the first phase change region and a second electrode separating the second ovonic threshold switch and the second phase change region.

25. The method of claim 23, comprising forming a bitline separated from the first phase change region by the third ovonic threshold switch and from the second phase change region by the fourth ovonic threshold switch.

26. The method of claim 23, comprising forming a wordline separated from the first phase change region by the first ovonic threshold switch and from the second phase change region by the second ovonic threshold switch.

27. The method of claim 26, comprising forming electrodes separating the wordline and the first and second ovonic threshold switches.

28. A method, comprising:
forming a first and a second phase change memory cell, the forming including:
forming a first ovonic threshold switch spaced from a second ovonic threshold switch in a first dielectric layer;
forming a second dielectric layer over the first and second ovonic threshold switches and the first dielectric layer;
forming a trench in the second dielectric layer, the trench being positioned over the first and second ovonic threshold switches;
forming a phase change layer along sidewalls of the trench;
forming a first and a second phase change region as sidewall spacers by anisotropically etching the phase change layer, the first phase change region being positioned on the first ovonic threshold switch and the second phase change region being positioned on the second ovonic threshold switch;
forming a third dielectric layer in the trench separating the first and second phase change regions;
forming a third ovonic threshold switch on the first phase change region, the second phase change region, and the third dielectric layer, the first and third ovonic threshold switches being separated by the first phase change region and the second and third ovonic threshold switches being separated by the second phase change region.

29. The method of claim 28, comprising forming a first electrode separating the first ovonic threshold switch and the first phase change region and a second electrode separating the second ovonic threshold switch and the second phase change region.

30. The method of claim 28, comprising forming a bitline separated from the first phase change region by the third ovonic threshold switch and from the second phase change region by the third ovonic threshold switch.

31. The method of claim 28, comprising forming a wordline separated from the first phase change region by the first ovonic threshold switch and from the second phase change region by the second ovonic threshold switch.

32. The method of claim 31, comprising forming electrodes separating the wordline and the first and second ovonic threshold switches.

33. A method, comprising:
forming an array of memory cells in a plurality of rows and columns, the forming of the array including:
forming a first phase change memory cell in a first one of the columns, the forming of the first phase change memory cell including:
forming a first ovonic threshold switch from a first ovonic threshold switch layer;

forming a first phase change region from a first phase change layer on the first ovonic threshold switch layer; and forming a second ovonic threshold switch from a second ovonic threshold switch layer on the first phase change layer, the first and second ovonic threshold switch layers being separated by the first phase change layer;

forming a second phase change memory cell in the first one of the columns, the forming of the second phase change memory cell including:

forming a third ovonic threshold switch from the first ovonic threshold switch layer, the third ovonic threshold switch being spaced apart from the first ovonic threshold switch;

forming a second phase change region from the first phase change layer; and forming a fourth ovonic threshold switch from the second ovonic threshold switch layer.

34. A phase change memory, comprising:

an array of memory cells having a plurality of rows and columns, the array including:

a first phase change memory cell formed in a first one of the columns, the first phase change memory cell including:

a first ovonic threshold switch formed from a first ovonic threshold switch layer;

a first phase change region formed from a first phase change layer on the first ovonic threshold switch layer; and a second ovonic threshold switch from a second ovonic threshold switch layer on the first phase change layer, the first and second ovonic threshold switch layers being separated by the first phase change layer;

a second phase change memory cell formed in the first one of the columns, the second phase change memory cell including:

a third ovonic threshold switch formed from the first ovonic threshold switch layer;

a second phase change region formed from the first phase change layer; and a fourth ovonic threshold switch formed from the second ovonic threshold switch layer.

35. A system, comprising:

a processor; and an array of memory cells having a plurality of rows and columns, the array including:

a first phase change memory cell formed in a first one of the columns, the first phase change memory cell including:

a first ovonic threshold switch formed from a first ovonic threshold switch layer;

a first phase change region formed from a first phase change layer on the first ovonic threshold switch layer; and a second ovonic threshold switch from a second ovonic threshold switch layer on the first phase change layer, the first and second ovonic threshold switch layers being separated by the first phase change layer;

a second phase change memory cell formed in the first one of the columns, the second phase change memory cell including:

a third ovonic threshold switch formed from the first ovonic threshold switch layer;

a second phase change region formed from the first phase change layer; and a fourth ovonic threshold switch formed from the second ovonic threshold switch layer.

* * * * *